(12) United States Patent
Kim et al.

(10) Patent No.: US 7,998,834 B2
(45) Date of Patent: Aug. 16, 2011

(54) SUBSTRATE LEVEL BONDING METHOD AND SUBSTRATE LEVEL PACKAGE

(75) Inventors: Chul-Soo Kim, Hwaseong-si (KR); Kuk-Jin Chun, Seoul (KR); Sung-Chan Kang, Seoul (KR); Jong-Hyuk Kim, Andong-si (KR); In-Sang Song, Yongin-si (KR); Duck-Hwan Kim, Goyang-si (KR); Jae-Shik Shin, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/646,691

(22) Filed: Dec. 23, 2009

(65) Prior Publication Data

US 2010/0167498 A1    Jul. 1, 2010

(30) Foreign Application Priority Data

Dec. 23, 2008    (KR) ........................ 10-2008-0132502

(51) Int. Cl.
*H01L 21/30* (2006.01)
*H01L 21/00* (2006.01)

(52) U.S. Cl. ........................................ 438/455; 438/118
(58) Field of Classification Search ........................ None
See application file for complete search history.

(56) References Cited

U.S. PATENT DOCUMENTS

2007/0243662 A1*    10/2007    Johnson et al. ............... 438/106

FOREIGN PATENT DOCUMENTS

| JP | 11-68294 | 3/1999 |
|----|----------|--------|
| JP | 11-86723 | 3/1999 |
| KR | 10-2006-0073316 | 6/2006 |

* cited by examiner

*Primary Examiner* — Scott B Geyer
(74) *Attorney, Agent, or Firm* — Staas & Halsey, LLP

(57) ABSTRACT

Disclosed are a substrate level bonding method and a substrate level package formed thereby. The substrate level package includes a plurality of unit substrate sections, a base substrate, and a plurality of substrate adhesion sections. The unit substrate sections are separated from each other by holes. The base substrate is disposed to face the unit substrate sections. The substrate adhesion sections are interposed between the unit substrate sections and the base substrate to bond the unit substrate sections to the base substrate and which are formed of DFR material, whose at least one portion is uncured.

12 Claims, 13 Drawing Sheets

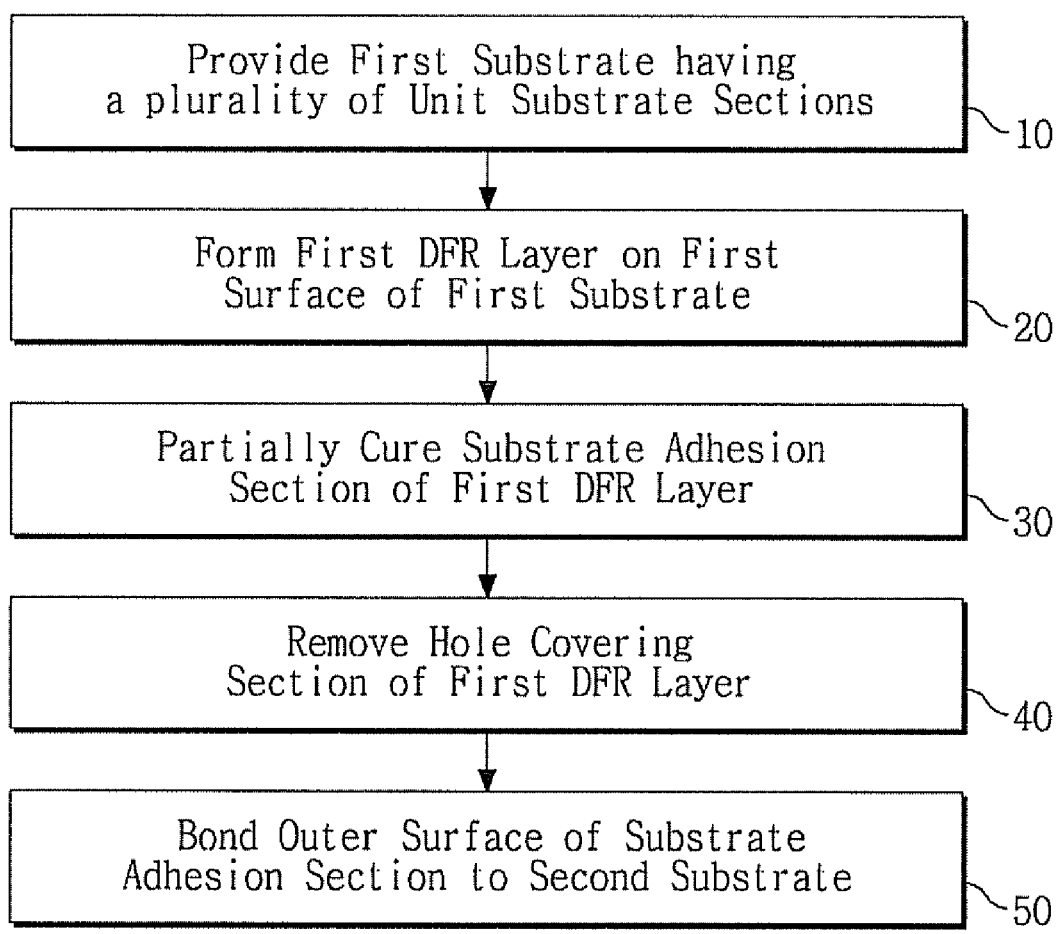

SUBSTRATE LEVEL BONDING METHOD AND SUBSTRATE LEVEL PACKAGE

CROSS-REFERENCE TO RELATED APPLICATIONS

This application claims the benefit under 35 U.S.C. §119(a) of Korean Patent Application No. 10-2008-132502, filed on Dec. 23, 2008 in the Korean Intellectual Property Office, the disclosure of which is incorporated by reference in its entirety.

BACKGROUND

1. Field

The following description relates to a substrate level bonding method and a substrate level package, and more particularly, to a substrate level bonding method and a substrate level package that are applied to a flip chip package or an RF chip package for a general memory semiconductor chip, and a flip chip on glass package for an LCD driver chip to be used in a wafer level module.

2. Description of the Related Art

Substrate level packaging is a process in which at least two substrates are bonded in the form of a wafer such that the substrates are electrically connected to each other, and then the wafer is cut into units of chips, thereby allowing single packages to be manufactured.

Recently, in this technique, DFR (Dry Film Resist) has been used as an adhesive to bond the substrates to each other.

Since the DFR is laminated on an upper surface of the substrate in the form of a film which is not in a liquid state, the DFR can be applied to a substrate having a via hole. In addition, since the DFR is effectively welded to the substrate at a low temperature, for example, at 120° C. or below, a circuit pattern formed on the substrate is prevented from being deformed due to high temperature.

The process of bonding substrates using DFR as an adhesive includes laminating DFR on a lower substrate, curing the DFR through an exposure and then thermally bonding the outer surface of the cured DFR to a surface of an upper substrate which faces the lower substrate.

However, after the DFR has been cured, it is difficult for the DFR to adhere to the substrate while being able to adjust to the shape of a surface of the substrate to which it is to adhere. As a result, the bonding force of the DFR is degraded.

SUMMARY

Accordingly, it is an aspect of the present invention to provide a substrate level bonding method capable of providing superior bonding force between substrates even when the process temperature is low or when the substrates have a plurality of holes, and a substrate level package formed thereby.

Accordingly, it is an aspect of the present invention to provide a substrate level bonding method, in which substrates are bonded to each other adaptably with respect to surface properties of the substrates, and a substrate level package formed thereby.

Additional aspects and/or advantages will be set forth in part in the description which follows and, in part, will be apparent from the description, or may be learned by practice of the invention.

The foregoing and/or other aspects of the present invention may be achieved by providing a substrate level boding method, the method comprising: providing a first substrate having a plurality of holes passing from a first surface to a second surface of the first substrate and a plurality of unit substrate sections separated from each other by the holes; forming a Dry Film Resist (DFR) layer on the first surface to cover the holes and the unit substrate sections; curing portions of substrate adhesion sections of the DFR layer corresponding to and covering the unit substrate sections; removing hole covering sections of the DFR layer corresponding to and covering the holes; and bonding outer surfaces of the substrate adhesion sections to a second substrate.

The foregoing and/or other aspects of the present invention may by achieved by providing a substrate level bonding method, the method comprising: providing a first substrate having a plurality of holes passing from a first surface to a second surface of the first substrate, a plurality of unit substrate sections separated from each other by the holes, and a plurality of first substrate adhesion sections that are formed of Dry Film Resist (DFR) material and are formed on first surfaces of the unit substrate sections; curing first edge adhesion sections of the first substrate adhesion sections which cover edges of the first surfaces of the unit substrate sections; and bonding a second substrate to the first substrate adhesion sections.

The foregoing and/or aspects of the present invention may be achieved by providing a substrate level package including: a plurality of unit substrate sections separated from each other by holes; a base substrate disposed to face the unit substrate sections; and a plurality of substrate adhesion sections which are interposed between the unit substrate sections and the base substrate to bond the unit substrate sections to the base substrate and which are formed of DFR material, whose at least one portion is uncured.

The foregoing and/or other aspects of the present invention may be achieved by providing a substrate level package comprising: a plurality of unit substrate sections separated from each other by holes; a lower substrate bonded to lower surfaces of the unit substrate sections; an upper substrate bonded to upper surfaces of the unit substrate sections; a plurality of first substrate adhesion sections, which are interposed between the unit substrate sections and the lower substrate to bond the unit substrate sections to the lower substrate and are formed of DFR material, whose at least one portion is not cured; and a plurality of second substrate adhesion sections, which are interposed between the unit substrate sections and the upper substrate to bond the unit substrate sections to the upper substrate and are formed of DFR material, at least one of the second substrate sections not being cured.

BRIEF DESCRIPTION OF THE DRAWINGS

FIG. 1 is a flowchart showing a substrate level bonding method according to an exemplary embodiment;

FIGS. 2A to 8 are cross-sectional views showing processes of the substrate level bonding method of FIG. 1, in which FIGS. 2A and 2B are cross-sectional views showing a process of providing a first substrate;

FIG. 3 is a cross-sectional view showing a DFR (Dry Film Resist) layer which is formed on a first surface of the first substrate to cover a plurality of holes and unit substrate sections according to an embodiment of the present invention;

FIG. 5 is a cross-sectional view showing a process of removing a protective film from the DFR layer according to an embodiment of the present invention;

FIG. 6 is a cross-sectional view showing a process of removing hole covering sections of the DFR layer corresponding to and covering the holes according to an embodiment of the present invention;

FIG. 7 is a cross-sectional view showing a process of bonding an outer surface of the substrate adhesion section to a second substrate according to an embodiment of the present invention;

FIG. 8 is a cross-sectional view showing a process of connecting the second substrate to the unit substrate section according to an embodiment of the present invention;

FIGS. 10A to 13 are views showing an example of the substrate level bonding method shown in FIG. 9, in which FIGS. 10A to 10C are cross-sectional views showing a process of forming a substrate adhesion section on a first surface of a first substrate to cover holes and unit substrate sections;

FIG. 11 is a cross-sectional view showing a process of curing portions of substrate adhesion sections which cover each of the unit substrate sections according to an embodiment of the present invention;

FIG. 12 is a cross-sectional view showing a process of removing hole covering sections corresponding to and covering the holes according to an embodiment of the present invention;

FIG. 13 is a cross-sectional view showing a process of bonding an outer surface of the substrate adhesion sections to a second substrate according to an embodiment of the present invention;

FIGS. 14 to 17 are cross-sectional views showing another example of the substrate bonding method shown in FIG. 9, in which FIG. 14 is a cross-sectional view showing a process of forming substrate adhesion sections on both surfaces of the unit substrate sections;

FIG. 15 is a cross-sectional view showing a process of curing portions of the substrate adhesion sections which cover first surfaces of the unit substrate sections, respectively, according to an embodiment of the present invention of FIG. 14;

FIG. 16 is a cross-sectional view showing a process of curing portions of the substrate adhesion sections which cover second surfaces of the unit substrate sections, respectively according to an embodiment of the present invention of FIG. 14;

FIG. 17 is a cross-sectional view showing a process of bonding a second substrate and a third substrate to the both surfaces of the unit substrate section;

DETAILED DESCRIPTION

Figure 2A:
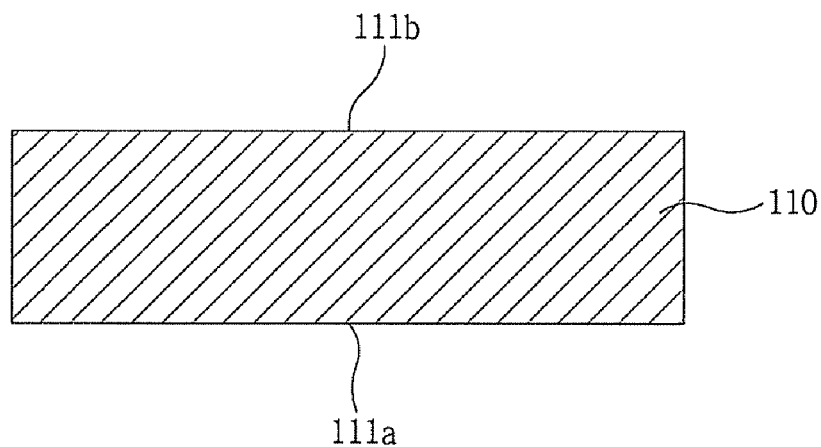
Figure 2B:
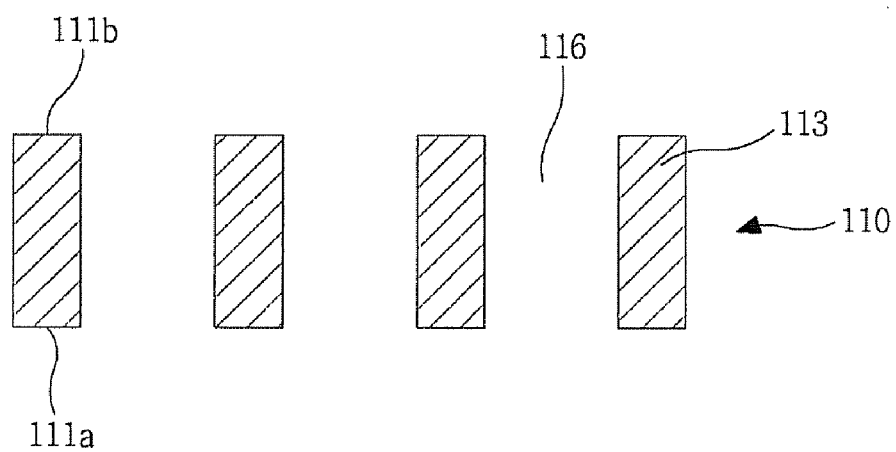

Reference will now be made in detail to the embodiments, examples of which are illustrated in the accompanying drawings, wherein like reference numerals refer to the like elements throughout. The embodiments are described below to explain the present invention by referring to the figures.

FIG. 1 is a flowchart showing processes of a substrate level bonding method according to an exemplary embodiment. Referring to FIG. 1, the substrate level bonding method is performed as follows. First, a first substrate is provided in which the first substrate includes a plurality of holes, which pass from a first surface to a second surface of the first substrate, and a plurality of unit substrate sections that are separated from each other by the holes (operation 10). Then, a Dry Film Resist (DFR) layer is formed on the first surface of the first substrate to cover the holes and the unit substrate sections (operation 20). Substrate adhesion sections of the DFR layer, which respectively cover the unit substrate sections, are partially cured (operation 30). Portions of the DFR layer which cover the holes (hereinafter referred to as "hole covering sections") are removed (operation 40). Then, outer surfaces of the substrate adhesion section are bonded to a second substrate (operation 50).

Since the substrate adhesion section used to bond the unit substrate section to the second substrate is partially cured, the bonding between the unit substrate section and the second substrate is effectively performed regardless of a surface roughness of the substrate.

In this case, the curing of the substrate adhesion sections includes curing an edge adhesion section of the substrate adhesion section, which covers the edge of the first surface of the unit substrate section. That is, the edge of the substrate adhesion section is cured, and the center of the substrate adhesion section is not cured. Accordingly, the uncured central adhesion section of the substrate adhesion section is protected by the cured edge adhesion section and is prevented from being cured.

FIGS. 2A to 6 are cross-sectional views showing processes of the substrate level bonding method illustrated in FIG. 1. The respective processes of the substrate level bonding method will be described with reference to FIGS. 2A to 6. First, as shown in FIGS. 2A and 2B, the holes 116 passing from the first surface 111a to the second surface 111b are formed, thereby forming the first substrate 110 provided with unit substrate sections 113 separated from each other by the holes 116. The first substrate 110 may be a silicon (Si) substrate which is generally used to manufacture semiconductor devices or integrated circuits.

After the first substrate 110 has been provided, the holes 116 are formed in the first substrate 110 through an etching process, so that the unit substrate sections 113 are formed. As a result, a single package unit including the unit substrate sections 113 adjacent to each other is formed.

Figure 3:
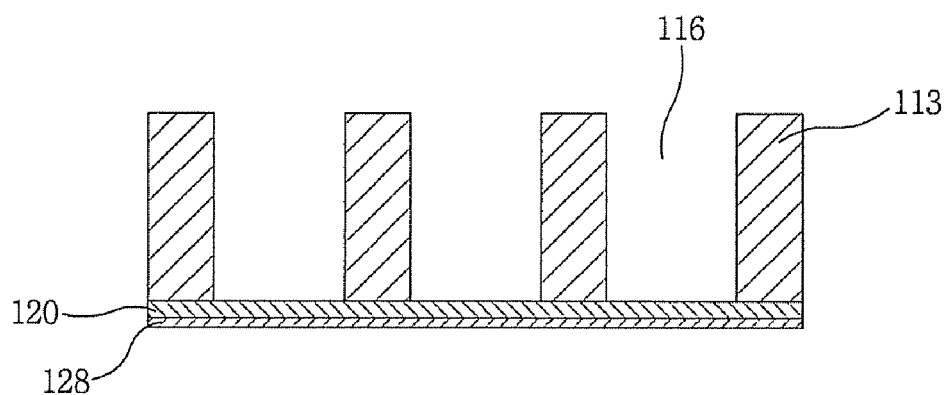

After that, as shown in FIG. 3, the DFR (Dry Film Resist) layer 120 is covered on the first surface 111a of the first substrate 110 including the holes 116 and the unit substrate sections 113. The covering of the first surfaces 111a is performed by laminating the DFR layer 120 on the first substrate 110 in the form of a film.

Protective films 128 may be attached to outer surfaces of the DFR layer 120.

Figure 4A:
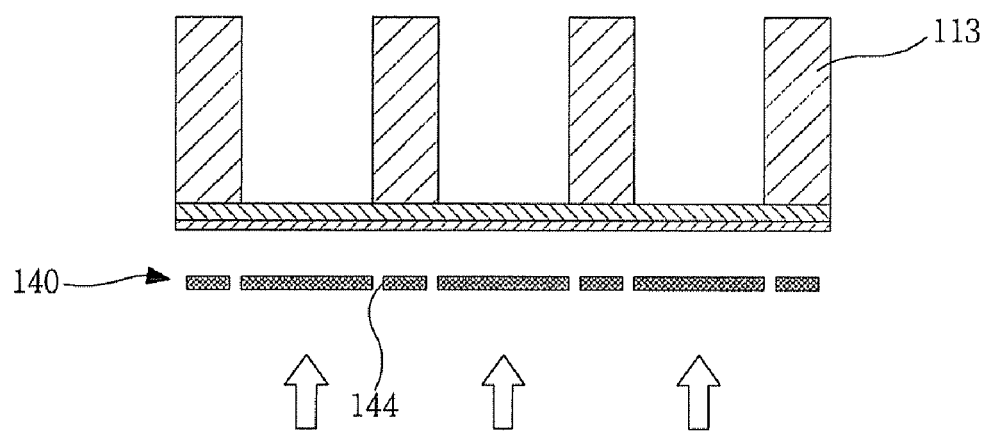
FIGS. 4A and 4B are cross-sectional views showing processes of curing portions of substrate adhesion sections of the DFR layer which cover the unit substrate sections, respectively according to an embodiment of the present invention.
Figure 4B:
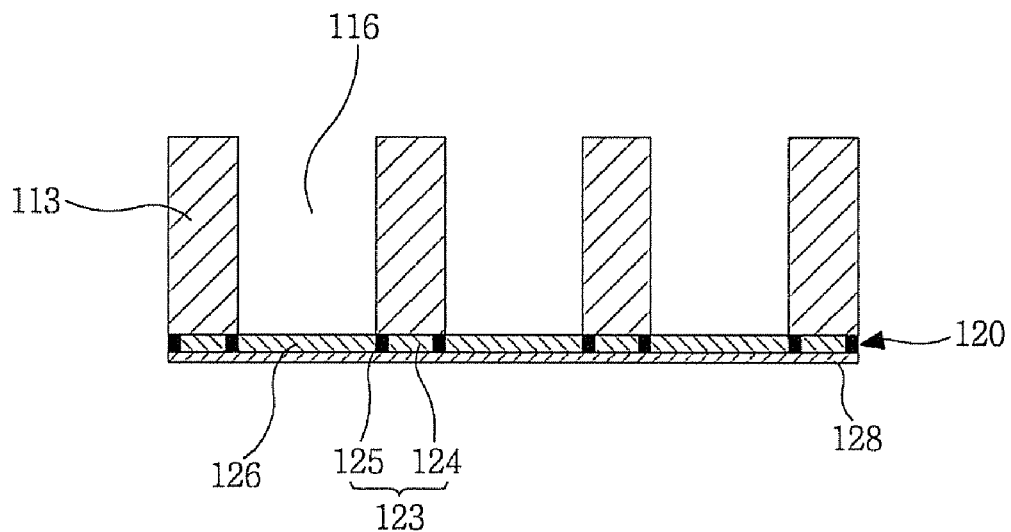

After that, as shown in FIG. 4B, portions of the substrate adhesion sections 123 of the DFR layer 120 corresponding to and covering the unit substrate sections 113, are subject to a curing process.

The DFR layer 120 includes the substrate adhesion sections 123 and the hole covering sections 126. The substrate adhesion sections 123 respectively cover the unit substrate sections 113 of the first substrate 110. The hole covering sections 126 respectively cover the holes 116 of the first substrate 110.

The substrate adhesion section 123 is provided with the central adhesion section 124 and the edge adhesion section 125. The central adhesion section 124 covers the center of the unit substrate section 113. The edge adhesion section 125 covers the edge of the unit substrate section 113.

The edge adhesion section 125 is cured whereas the central adhesion section 124 is not cured. That is, the edge adhesion section 125 of the substrate adhesion section 123, which covers the edge of the unit substrate section 113, is cured. The central adhesion section 124 of the substrate adhesion section 123, which is surrounded by the edge adhesion section 125, is not cured. As a result, the cured edge adhesion section 125 surrounds the uncured central adhesion section 124, thereby protecting the central adhesion section 124 from external forces.

The curing of the edge adhesion section 125 of the substrate adhesion section 123 is performed as follows. As shown in FIG. 4A, a photo mask 140 which has holes 144 to expose the edge adhesion section 125 is disposed adjacent to the first surface 111a of the first substrate 110. As shown in FIG. 4B, the DFR layer 120 is subject to an exposure process by passing light through the photo mask 140.

That is, since portions of the photo mask 140 corresponding to the edge adhesion section 125 are perforated, only the portion of the DFR layer 120, which covers the edge of the unit substrate section 113 is cured.

Figure 5:
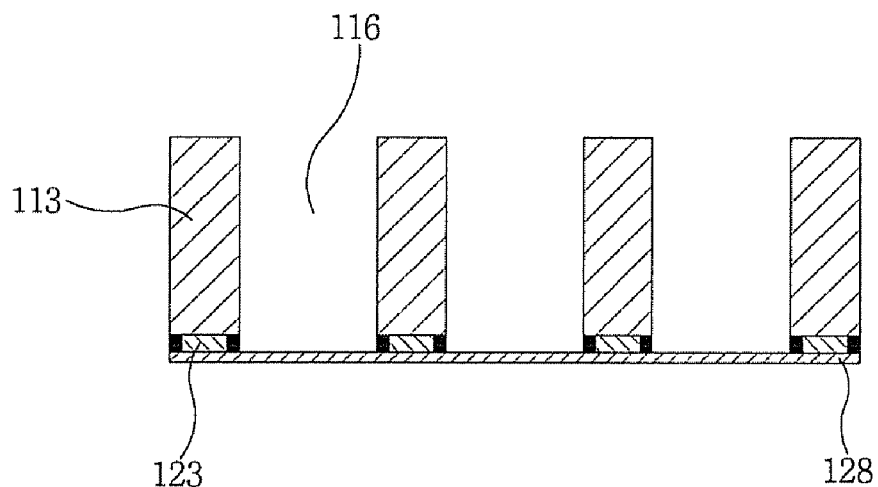

After that, as shown in FIG. 5, the hole covering sections 126 of the DFR layer 120, which respectively cover the holes 116, are removed. To this end, the DFR layer 120 is subject to a wet etching process or a dry etching process. As an example, developer is sprayed in a direction from the second surface 111b of the first substrate 110 to the DFR layer 120. Accordingly, the developer passes through the holes 116 and then makes contact with the first substrate 110, so the hole covering sections 126 of the DFR layer 120 are removed.

In this case, since the edge adhesion section 125 of the substrate adhesion section 123 serves as a protective wall, the developer is prevented from being introduced into the central adhesion section 124. As a result, the central adhesion section 124 is not developed.

Figure 6:
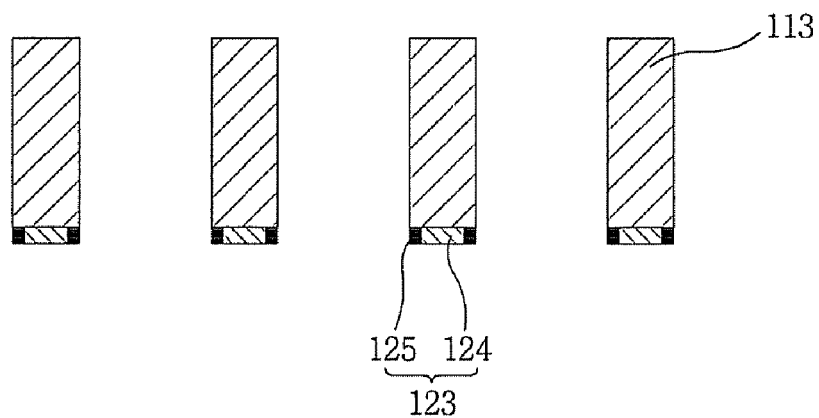

In addition, the protective film 128 formed on the outer surface of the DFR layer 120 also prevents the developer from being introduced into the central adhesion section 124 during the developing process. As shown in FIG. 6, after the hole covering sections 126 have been removed from the DFR layer 120, the protective film 128 is removed.

Figure 7:
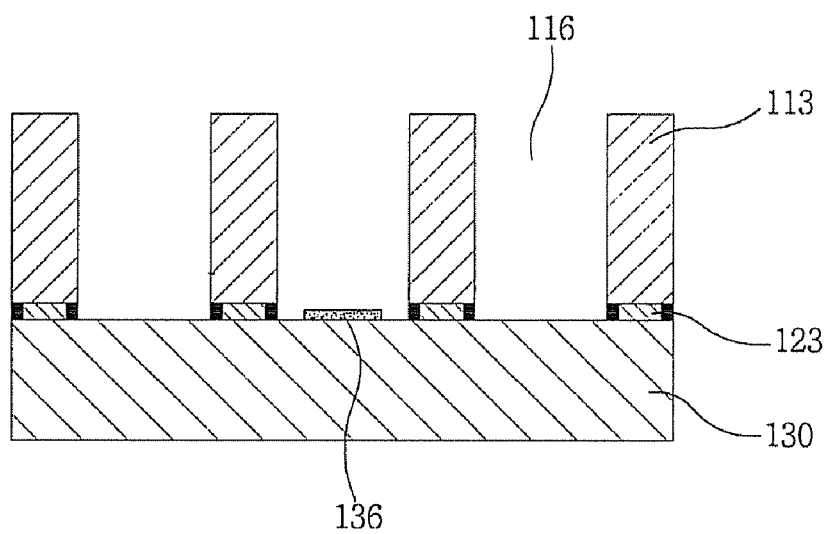

After that, as shown in FIG. 7, the second substrate 130 is bonded to the outer surfaces of the substrate adhesion sections 123. The bonding of the second substrate 130 to the substrate adhesion sections 123 is performed by pressing the substrate adhesion sections 123 against the second substrate 130 at a low temperature, for example, at a temperature of about 100° C. to about 120° C. As apparent from the above description, the bonding process is effectively performed at a low temperature of 120° C. or below and thus fine patterns of the substrate are not damaged during the bonding process.

Also, since the uncured central adhesion section 124 (see FIG. 6) mainly adheres to the second substrate 130, the substrate adhesion section 123 adheres in correspondence to a surface shape of the substrate, so that the bonding force is improved.

If the DFR layer 120 is bonded, hermeticity is maintained. Accordingly, the DFR layer is not easily detached by PR (Photo Resist) striper such as acetone.

Figure 8:
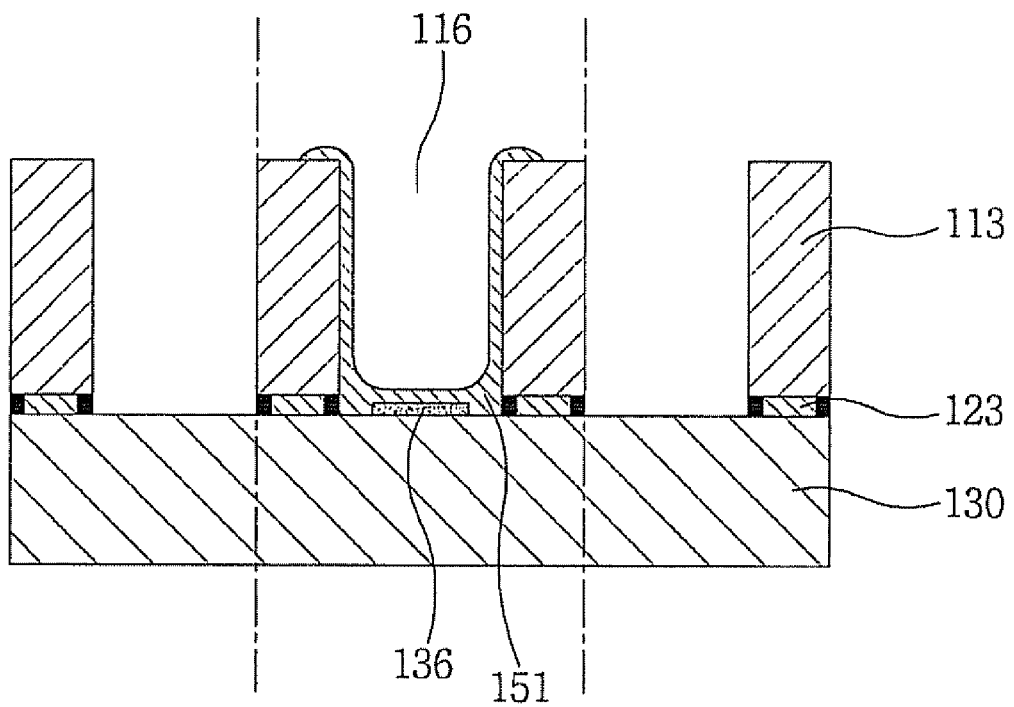

Meanwhile, die pads 136 may be respectively formed on portions of the second substrate 130, which are exposed to the outside through the holes 116. As shown in FIG. 8, material for metal deposition 151 is deposited between the die pads 136 and the unit substrate sections 113, thereby forming a vertical interconnection between the die pads 136 and the unit substrate sections 113. Thereafter, the structure including the die pad 136 and the unit substrate sections 113 is separated in a predetermined unit, so that a substrate level package is formed.

Figure 9:
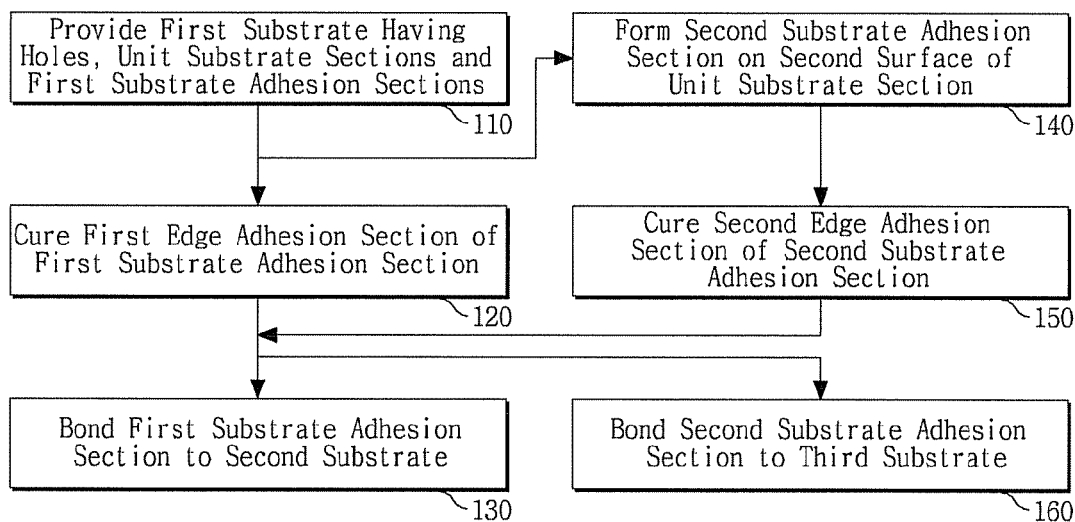
FIG. 9 is a flowchart showing a substrate bonding method according to another exemplary embodiment.

FIG. 9 is a flowchart showing a substrate bonding method according to a second exemplary embodiment. The substrate level bonding method according to the second exemplary embodiment is performed as follows. First, a first substrate is provided in which the first substrate includes a plurality of holes passing from a first surface to a second surface of the first substrate, a plurality of unit substrate sections separated from each other by the holes, and first substrate adhesion sections, which are formed of DFR and are respectively formed on first surfaces of the unit substrate sections (operation 110). Then, first edge adhesion sections of the first substrate adhesion sections, which respectively cover edges of the first surfaces of the unit substrate sections are cured (operation 120). A second substrate is boned to the first substrate adhesion sections (operation 130).

In this case, before the second substrate is bonded to the first substrate adhesion sections, second substrate adhesion sections formed of DFR material are respectively formed on second surfaces of the unit substrate sections (operation 140), second edge adhesion sections of the second substrate adhesion sections, which respectively cover edges of the second surfaces of the unit substrate sections, are cured (operation 150), and thereafter a third substrate is bonded to the second substrate adhesion sections (operation 160).

FIGS. 10A to 13 are views showing processes of the substrate level bonding method according to another exemplary embodiment. As shown in FIG. 10C, the first substrate 210 including the holes 216, the unit substrate sections 213 and the first substrate adhesion sections 220 is provided. The holes 216 pass from the first surface 211a to the second surface 211b of the first substrate 210. The unit substrate sections 213 are separated from each other by the holes 216. The first substrate adhesion sections 220 are formed of DFR material and are respectively formed on the first surfaces 211a of the unit substrate sections 213.

Figure 10A:
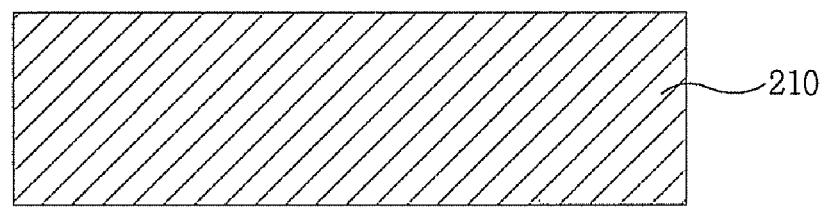
Figure 10B:
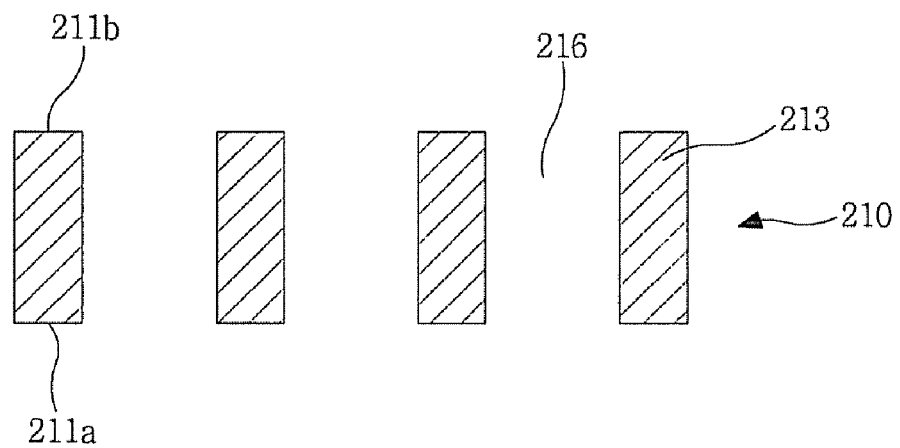
Figure 10C:
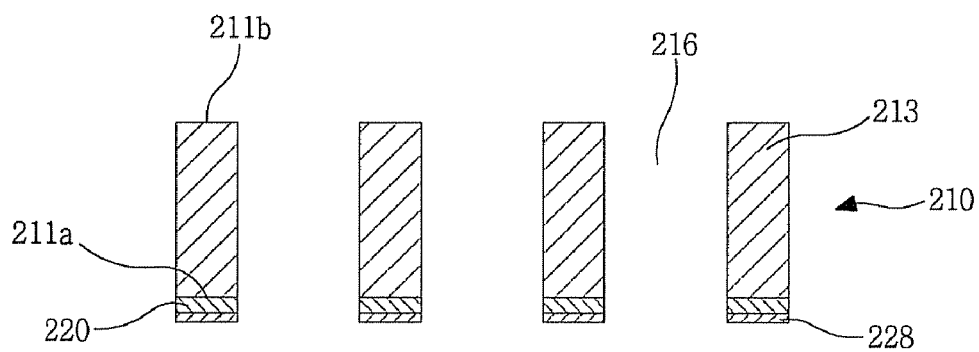

As shown in FIG. 10A, first, the first substrate 210 is provided. After that, as shown in FIG. 10B, the holes 216 are formed in the first substrate 210 through an etching process, thereby forming the unit substrate sections 213. As a result, two adjacent unit substrate sections 213 form a single package unit. After that, as shown in FIG. 10C, the first substrate adhesion sections 220 formed of DFR material are respectively formed on the first surfaces 211a of the unit substrate sections 213. In this case, first protective films 228 may be attached to outer surfaces of the first substrate adhesion sections 220.

The process of respectively forming the first substrate adhesion sections 220 including DFR material on the first surfaces 211a of the unit substrate sections 213 may be performed using various techniques. In a first example, a DFR film is laminated on the first surfaces 211a of the first substrate 210 having the holes 216, and exposure and developing processes are performed with respect to the holes 216 in a direction from above the second surfaces 211b of the first substrate 210. As a result, portions of the DFR film blocking the holes 216 are removed and only the first substrate adhesion sections 220 remain. The method of forming the first substrate adhesion sections 220 on the first surfaces 211a of the unit substrate section 213 are not limited to that described herein.

Figure 11:
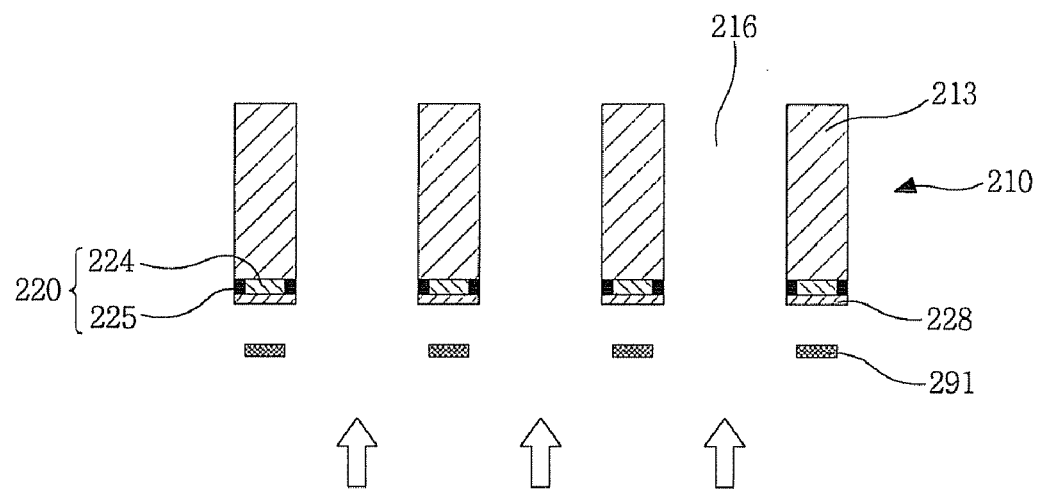

Next, as shown in FIG. 11, the first edge adhesion section 225 of the first substrate adhesion section 220 is cured. In this case, the first edge adhesion section 225 is a portion covering the edge of the unit substrate section 213. In addition, a first central adhesion section 224 is a portion covering the center of the unit substrate section 213.

The curing of the first edge adhesion sections 225 is performed as follows. First, a photo mask 291 which is perforated to expose the first edge adhesion section 225 is disposed adjacent to the outer surfaces of the first substrate adhesion sections 220. After that, the first edge adhesion sections 225 are exposed to light passing through the photo mask 291.

Figure 12:
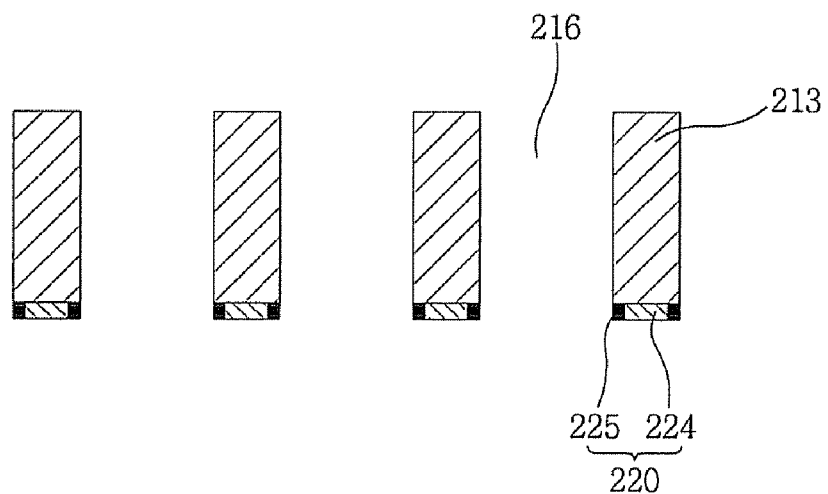

The photo mask 291 is formed to block only the first central adhesion section 224. For this reason, if the photo mask 291 is disposed adjacent to the first substrate 210 between the first surfaces 211*a* (see FIG. 10C) of the first substrate 210 and a light source (not shown), if ultraviolet rays are then radiated toward the first substrate 210 from the light source, only the first edge adhesion sections 225 are exposed to the ultraviolet rays and cured and the first central adhesion sections 224 are not exposed and thus not cured. After the curing of the first edge adhesion sections 225, as shown in FIG. 12, the first protective films 228 are removed.

Figure 13:
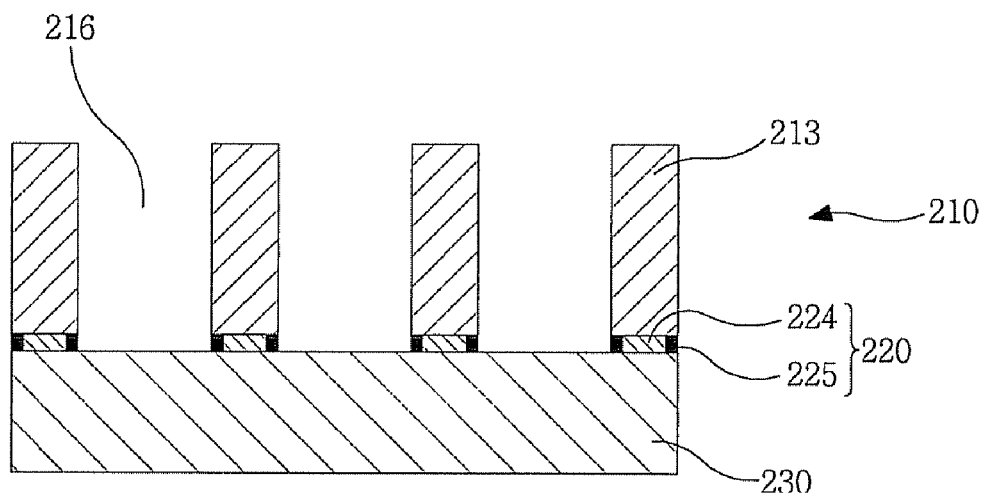

After that, as shown in FIG. 13, the second substrate 230 is bonded to the first substrate adhesion sections 220, thereby bonding the first substrate 210 and the second substrate 230 to each other.

Meanwhile, die pads may be respectively formed on portions of the second substrate 230, which are exposed through the holes 216, and thus a vertical interconnection is formed between the die pads and the unit substrate sections 213 of the first substrate 210, thereby forming a substrate level package.

Figure 17:
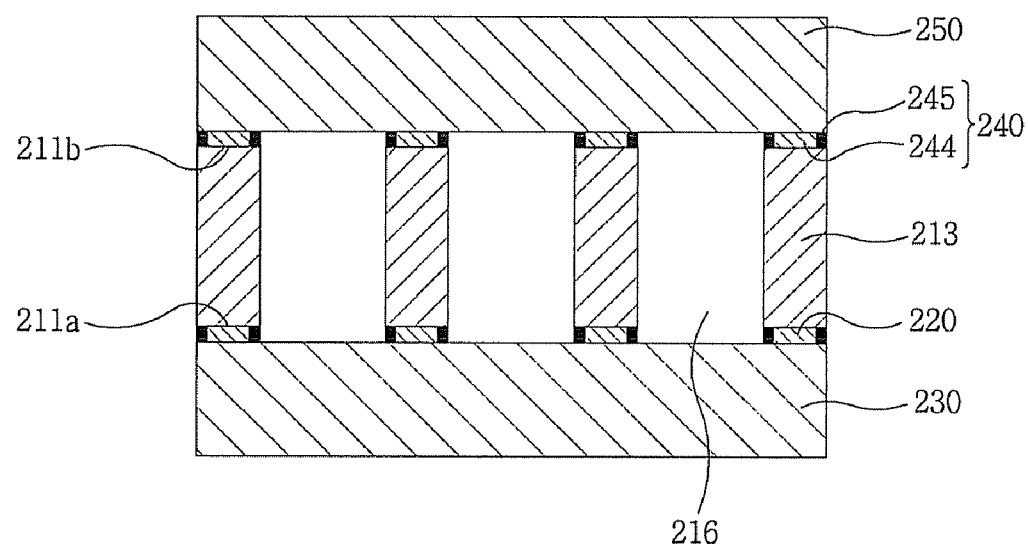

Meanwhile, as shown in FIG. 17, a substrate may be bonded to the second surfaces 211*b* of the unit substrate sections 213. First, the second substrate adhesion sections 240 including DFR are formed on the second surfaces 211*b* of the unit substrate sections 213, respectively. The second edge adhesion sections 245 of the second substrate adhesion sections 240, which respectively cover the edges of the second surfaces 211*b* of the unit substrate section 213 are cured. After that, the third substrate 250 is bonded to the second substrate adhesion section 240.

Before the first edge adhesion sections 225 are bonded to the second substrate 230, the second substrate adhesion sections 240 are formed and thereafter the second edge adhesion sections 245 are cured.

Figure 14:
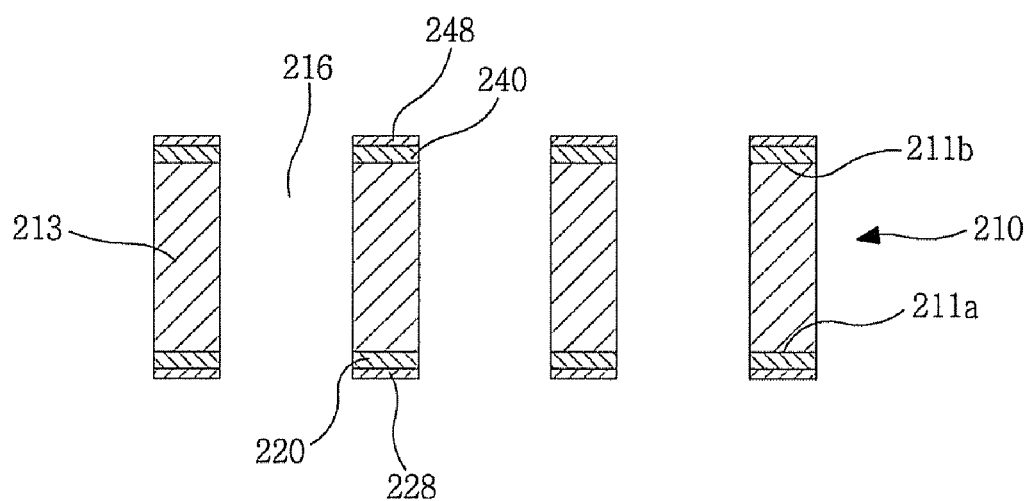

FIGS. 14 to 17 are cross-sectional views showing processes in which the first surface 211*a* and the second surface 211*b* of the unit substrate section 213 are respectively bonded to the second substrate 230 and the third substrate 250, according to one exemplary embodiment. First, as shown in FIG. 14, the first substrate adhesion section 220 and the second substrate adhesion section 240 are respectively formed on the first surface 211*a* and the second surface 211*b* of the unit substrate section 213. In this case, the first protective film 228 is attached to the outer surface of the first substrate adhesion section 220, and a second protective film 248 is attached to the outer surface of the second substrate adhesion section 240.

Figure 15:
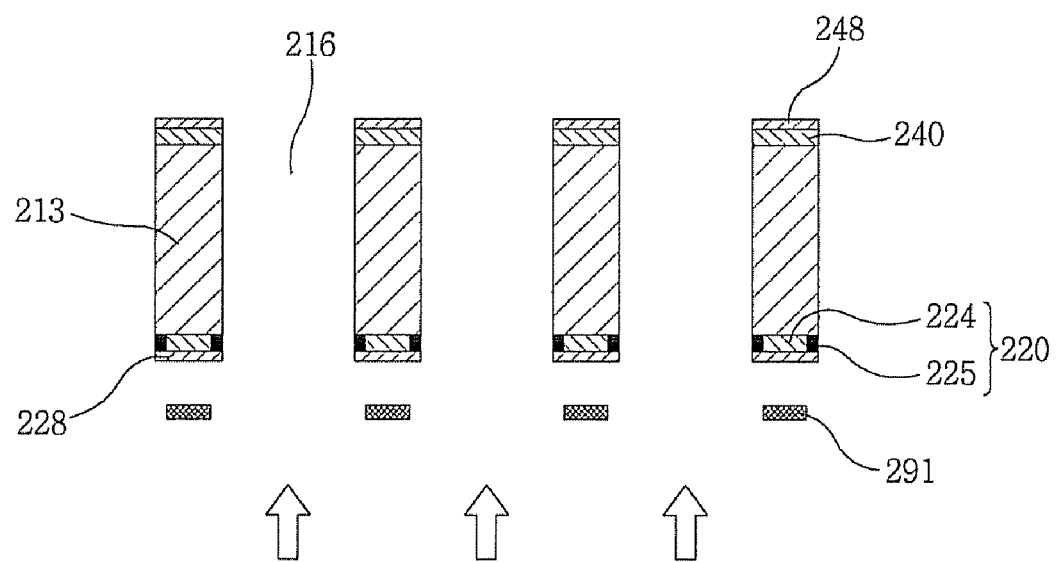

After that, as shown in FIG. 15, the first edge adhesion sections 225 of the first substrate adhesion sections 220 are cured. In this case, light is blocked from being incident on the first central adhesion section 224 by the photo mask 291 and thus the first central adhesion section 224 is not cured.

Figure 16:
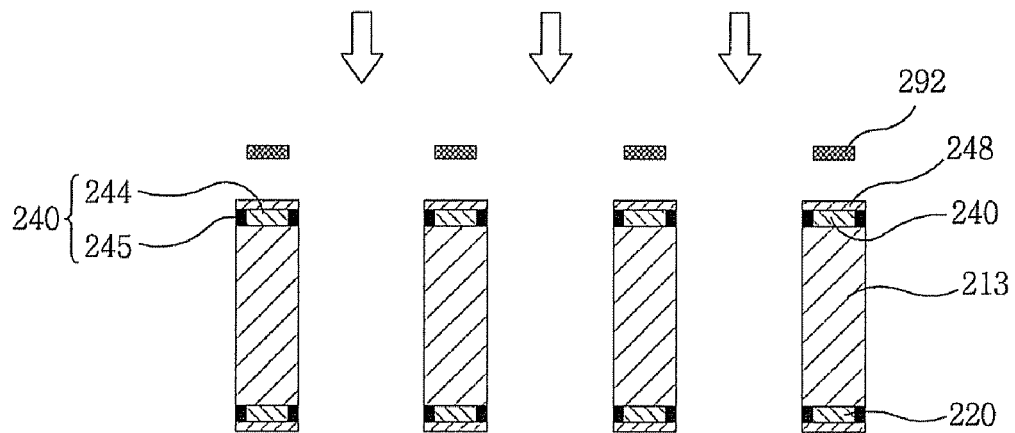

As shown in FIG. 16, the second edge adhesion sections 245 of the second substrate adhesion sections 240 are cured. In this case, light is blocked from being incident on the second central adhesion section 244 by a photo mask 292 and thus the second central adhesion section 244 is not cured. After that, the first and second protective films 228 and 248 are removed.

Sequentially, as shown in FIG. 17, the second substrate 230 is bonded to the first substrate adhesion sections 220, and the third substrate 250 is bonded to the second substrate adhesion sections 240.

The second substrate adhesion sections 240 are formed on the second surfaces 211*b* of the first substrate 210 through various processes. For example, a DFR film is laminated on the second surface 211*b* of the first substrate 210 having the holes 216, and an exposure and developing process is performed on the holes 216 in a direction from above the first surface 211*a* of the first substrate 210. As a result, portions of the DFR film blocking the holes 216 are removed from the DFR film and only the second substrate adhesion sections 240 remain. The photo mask 291 may be disposed on the first surfaces 211*a* of the first unit substrate sections 213 to protect the first substrate adhesion section 220. The method of respectively forming the second substrate adhesion sections 240 on the second surfaces 211*b* of the unit substrate sections 213 is not limited.

In this case, the second substrate adhesion sections 240 are formed on the second surface 211*b* of the first substrate 210 such that the protective films 248 remain on the outer surfaces of the second substrate adhesion sections 240. After that the protective films 248 are removed, the third substrate 250 is bonded to the second substrate adhesion section 240.

Accordingly, the second substrate 230 and the third substrate 250 form a module while maintaining an interval between each other due to the unit substrate sections 213.

The substrate level structure described above may be applied to various fields, for example, a camera module. In the case of a camera module at a wafer level, the unit substrate sections 213 serve as a spacer between substrates. In this case, at least one of the second substrate 230 and the third substrate 250 may be a lens substrate having a lens member while a preset interval is maintained between the second and third substrates 230 and 250 due to the unit substrate sections 213.

As described above, when the camera module is manufactured, since the spacer does not need to be additionally manufactured, the cost spent on a mold for the spacer can be reduced, the manufacturing time for the module can be reduced, and a module of fine and compact structure can be obtained.

Figure 18:
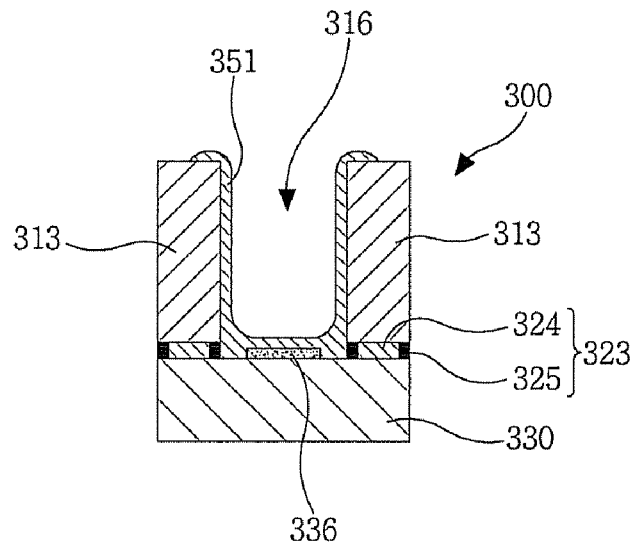
FIG. 18 is a cross-sectional view showing a substrate level package according to an exemplary embodiment.

FIG. 18 is a cross-sectional view showing a substrate level package according to another aspect of an exemplary embodiment. As shown in FIG. 18, a substrate level package 300 includes a plurality of unit substrate sections 313, a base substrate 330 and a plurality of substrate adhesion sections 323. A through hole 316 is formed between adjacent unit substrate sections 313. The substrate adhesion section 323 is interposed between the unit substrate sections 313 and the base substrate 330 to bond the unit substrate sections 313 to the base substrate 330. The substrate adhesion section 323 is formed of DFR material of which at least one portion is not cured.

Since the substrate adhesion section 323 includes DFR material of which at least one portion is not cured, the substrate adhesion section 323 can provide superior adhesion force regardless of a surface shape of the base substrate 330.

In this case, the substrate adhesion section 323 is provided with a central adhesion section 324 and an edge adhesion section 325. The central adhesion section 324 includes DFR material which is not cured. The edge adhesion section 325 is disposed to surround the central adhesion section 324 and includes cured DFR material. That is, the edge adhesion section 325 of the substrate adhesion section 323 is cured and the central adhesion section 324 of the substrate adhesion section 323 surrounded by the edge adhesion section 325 is not cured. In this manner, the cured edge adhesion section 325 surrounds the uncured central adhesion section 324, thereby protecting the central adhesion section 324 from external forces.

The central adhesion section 324 and the edge adhesion section 325 are integrally formed with each other and include the same DFR material. The central adhesion section 324 is not subject to the exposure process, and the edge adhesion section 325 is subject to the exposure process and thus cured.

In addition, a pad 336 is formed on a portion of the base substrate 330, which is externally exposed through the hole 316, and an interconnection including material for metal deposition 351 is formed between the pad 336 and the unit substrate sections 313 adjacent to the pad 336. As a result, adjacent unit substrate sections 313 and the base substrate 330 corresponding to the unit substrate sections 313 form a single chip.

Figure 19:
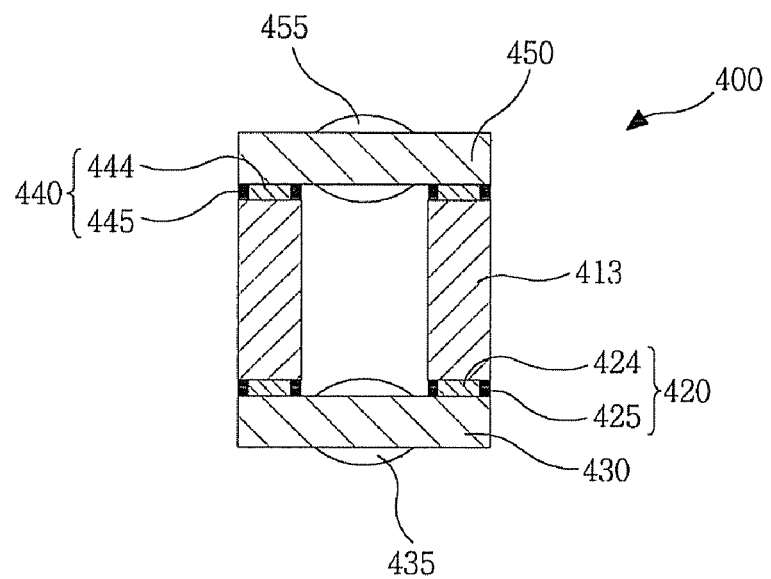
FIG. 19 is a cross-sectional view showing a substrate level package according to another exemplary embodiment.

FIG. 19 is a cross-sectional view showing a substrate level package 400 according to another exemplary embodiment. As shown in FIG. 19, a substrate level package 400 includes a plurality of unit substrate sections 413, a lower substrate 430, an upper substrate 450, a plurality of first substrate adhesion sections 420 and a plurality of second substrate adhesion sections 440.

A space is formed between adjacent unit substrate sections 413. The lower substrate 430 is bonded to a lower surface of the unit substrate section 413. The upper substrate 450 is bonded to an upper surface of the unit substrate section 413. The first substrate adhesion section 420 includes partially cured DFR material and is interposed between the unit substrate section 413 and the lower substrate 430, thereby bonding the unit substrate section 413 to the lower substrate 430. The second substrate adhesion section 440 includes partially cured DFR material and is interposed between the unit substrate section 413 and the upper substrate 450, thereby bonding the unit substrate section 413 to the upper substrate 450.

In this case, the first substrate adhesion section 420 is provided with a first central adhesion section 424 and a first edge adhesion section 425. The second substrate adhesion section 440 is provided with a second central adhesion section 444 and a second edge adhesion section 445. The first and second central adhesion sections 424 and 444 include uncured DFR material. The first and second edge adhesion sections 425 and 445 are disposed to respectively surround the first and second central adhesion sections 424 and 444, and include cured DFR material.

In this case, the first edge adhesion section 425 includes the same DFR material as the first central adhesion section 424, and the second edge adhesion section 445 includes the same DFR material as the second central adhesion section 444. The first and second central adhesion sections 424 and 444 are not subject to an exposure process, and the first and second edge adhesion sections 425 and 445 are subject to an exposure process to be cured.

In addition, the unit substrate section 413 serves as a spacer. A lens member 435 or 455 may be provided on at least one of the lower substrate 430 and the upper substrate 450.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A substrate level bonding method, the method comprising:
   providing a first substrate having a plurality of holes passing from a first surface to a second surface of the first substrate and a plurality of unit substrate sections separated from each other by the holes;
   forming a Dry Film Resist (DFR) layer on the first surface to cover the holes and the unit substrate sections;
   curing portions of substrate adhesion sections of the DFR layer corresponding to and covering the unit substrate sections;
   removing hole covering sections of the DFR layer corresponding to and covering the holes; and
   bonding outer surfaces of the substrate adhesion sections to a second substrate.

2. The method of claim 1, wherein, the curing of the portions of the substrate adhesion sections comprises curing edge adhesion sections of the substrate adhesion sections, which cover edges of first surfaces of the unit substrate sections.

3. The method of claim 2, wherein, the curing of the edge adhesion sections of the substrate adhesion section comprises:
   disposing a photo mask, which is perforated to expose the edge adhesion sections, adjacent to the first surface of the first substrate; and
   allowing light to pass through the photo mask such that the DFR layer is subjected to an exposure process.

4. The method of claim 2, wherein, the removing of the hole covering section comprises providing developer through the holes in a direction from the second surface to the first surface of the first substrate.

5. The method of claim 2, further comprising forming a protective film on an outer surface of the DFR layer; and
   removing the protective film from the DFR layer between the removing of the hole covering section of the DFR layer and the bonding of the outer surface of the substrate adhesion sections to the second substrate.

6. A substrate level bonding method, the method comprising:
   providing a first substrate having a plurality of holes passing from a first surface to a second surface of the first substrate, a plurality of unit substrate sections separated from each other by the holes, and a plurality of first substrate adhesion sections that are formed of Dry Film Resist (DFR) material and are formed on first surfaces of the unit substrate sections;
   curing first edge adhesion sections of the first substrate adhesion sections, which cover edges of the first surfaces of the unit substrate sections; and
   bonding a second substrate to the first substrate adhesion sections.

7. The method of claim 6, wherein the curing of the first edge adhesion sections comprises:
   disposing a photo mask, which is perforated to expose the first edge adhesion sections adjacent to outer surfaces of the first substrate adhesion sections; and
   allowing light to pass through the photo mask such that the first edge adhesion sections are subjected to an exposure process.

8. The method of claim 6, further comprising forming a protective film on the outer surface of the first substrate adhesion section; and
   removing the protective film from the first substrate adhesion section between the curing of the first edge adhesion sections of the first substrate adhesion sections and the bonding of the first edge adhesion sections to the second substrate.

9. The method of claim 6, further comprising, before the bonding of the first edge adhesion sections to the second substrate:
   forming second substrate adhesion sections formed of DFR material on a second surface of the unit substrate section, curing second edge adhesion sections of the second substrate adhesion section, which cover edges of second surfaces of the unit substrate sections, and bonding the second substrate adhesion sections to a third substrate.

10. The method of claim 9, wherein the curing of the second edge adhesion sections comprises:
    disposing a photo mask to expose the second edge adhesion sections of the second substrate adhesion sections; and
    allowing light to pass through the photo mask such that the second edge adhesion sections are subjected to an exposure process.

11. The method of claim 10, further comprising forming a protective film on outer surfaces of the second substrate adhesion sections when the second substrate adhesion sections are formed on the second surfaces of the unit substrate sections; and removing the protective film from the second substrate adhesion section between the curing of the second edge adhesion sections of the second substrate adhesion sections and the bonding of the outer surfaces of the second substrate adhesion sections to the third substrate.

12. The method of claim 6, wherein the providing of the first substrate comprises:
    providing the first substrate having the plurality of holes passing from the first surface to the second surface and the plurality of unit substrate sections separated from each other by the holes; and
    forming the first substrate adhesion section formed of the DFR material on the first surface of the unit substrate sections.

* * * * *